United States Patent [19]

Yamamoto et al.

[11] Patent Number: 5,533,388
[45] Date of Patent: Jul. 9, 1996

[54] APPARATUS FOR ELECTROMAGNETICALLY ISOLATING AN AUTOMOBILE

[75] Inventors: Akira Yamamoto; Masaaki Okabe; Yoshio Kaneko; Keiichi Shiraishi, all of Tokyo, Japan

[73] Assignee: Kabushiki Kaisha Meidensha, Tokyo, Japan

[21] Appl. No.: 391,651

[22] Filed: Feb. 21, 1995

[30] Foreign Application Priority Data

Feb. 23, 1994 [JP] Japan .................................. 6-024605
Mar. 28, 1994 [JP] Japan .................................. 6-056449

[51] Int. Cl.⁶ .............................................. G01M 17/00
[52] U.S. Cl. ........................................... 73/117; 73/862.17
[58] Field of Search ........................ 73/116, 117, 117.1, 73/117.3, 123, 125, 862.17

[56] References Cited

U.S. PATENT DOCUMENTS

| | | | |
|---|---|---|---|
| 3,520,180 | 7/1970 | Polhemus et al. | 73/71.7 |
| 4,825,690 | 5/1989 | Mears | 73/117 |
| 4,848,142 | 7/1989 | Fujimori et al. | 73/117 |
| 4,942,762 | 7/1990 | Schober et al. | 73/117 |
| 4,953,391 | 9/1990 | Schober et al. | 73/117 |
| 5,010,763 | 4/1991 | Schneider | 73/117 |
| 5,063,773 | 11/1991 | Fujimori et al. | 73/117 |
| 5,111,685 | 5/1992 | Langer | 73/117 |
| 5,142,902 | 9/1992 | Fujimori et al. | 73/117 |
| 5,154,076 | 10/1992 | Wilson et al. | 73/117 |
| 5,154,077 | 10/1992 | Fujimori | 73/117 |
| 5,193,386 | 3/1993 | Hesse, Jr. et al. | 73/117 |
| 5,277,060 | 1/1994 | Lehman et al. | 73/117 |
| 5,337,600 | 8/1994 | Kaneko et al. | 73/117 |

OTHER PUBLICATIONS

Meiden Review No. 1, 1994 Jan./Feb., vol. 234, p. 34, article 4.5, issued on Feb. 21, 1994.
Meiden Review No. 2, 1994 Mar./Apr., vol. 235, pp. 21–25, issued on Apr. 18, 1994.

*Primary Examiner*—Richard Chilcot
*Assistant Examiner*—Eric S. McCall
*Attorney, Agent, or Firm*—Foley & Lardner

[57] ABSTRACT

An electromagnetic compatibility simulating apparatus for an automobile including an electromagnetically shielded cell having a wall dividing the interior of the cell into a first chamber for the automobile and a second chamber. Road simulator units are mounted within the second chamber. Dynamometers are mounted within the second chamber in driving relation with the road simulator units. The wall has windows for allowing driving contact of the road simulator units with the road wheels, and blower openings for allowing air feed from blowers. Electromagnetic wave absorbers and reflecting wall portions are disposed on the windows. Expanded metals cover the blower openings or metal pipes are disposed between the blower and the blower openings. The wall has inspection windows with shutters on which electromagnetic shielding net is disposed. A controller is disposed outside the first and second chambers. Conductors connect the controller with the dynamometers and blowers. First and second filters are disposed in the conductors.

20 Claims, 10 Drawing Sheets

APPARATUS FOR ELECTROMAGNETICALLY ISOLATING AN AUTOMOBILE

BACKGROUND OF THE INVENTION

The present invention relates to an apparatus for electromagnetically isolating an automobile from an environment surrounding the automobile.

There have been provided apparatuses for simulating electromagnetic compatibility of many kinds of automobiles including electric cars to determine electromagnetic interference (EMI) between an automobile and environments surrounding the automobile. One of the prior art apparatuses includes an electromagnetically shielded cell having a wall dividing the interior of the cell into a first chamber for an automobile and a second chamber. Road simulator units are mounted within the second chamber. Dynamometers controlled by a controller are mounted within the second chamber in driving relation with the road simulator units. The wall has a plurality of windows for allowing driving contact of the road simulator units with road wheels of the automobile, inspection of inside of the second chamber, or the like.

There is a demand for an apparatus for electromagnetically isolating an automobile which is free from influence of electromagnetic wave generated from the dynamometer and controller in the electromagnetically shielded cell to thereby accomplish accurate simulation of EMC.

An object of the present invention is to provide an increased operating performance in the electromagnetically isolating apparatus by reducing the electromagnetic wave generated from the dynamometer and controller.

SUMMARY OF THE INVENTION

According to one aspect of the present invention, there is provided an apparatus for electromagnetically isolating an automobile from an environment surrounding the automobile, comprising:

an electromagnetically shielded cell having a wall dividing the interior of the cell into a first chamber for the automobile and a second chamber;

road simulator units mounted within the second chamber;

dynamometer means mounted within the second chamber in driving relation with the road simulator units;

the wall having window means for allowing driving contact of the road simulator units with the road wheels; and means for preventing electromagnetic wave from entering the first chamber through the window means.

According to another aspect of the present invention, there is provided an apparatus for electromagnetically isolating an automobile from an environment surrounding the automobile, comprising:

a first chamber for the automobile;

a second chamber disposed adjacent the first chamber;

means for shielding the first and second chambers from passing of electromagnetic wave between the first and second chambers and environments around the first and second chambers;

a wall disposed between the first and second chambers to cover the second chamber;

road simulator units mounted within the second chamber;

dynamometer means mounted within the second chamber in driving relation with the road simulator units;

blowers mounted within the second chamber;

a controller disposed outside the first and second chambers to prevent electromagnetic wave from entering the first and second chambers;

conductors connecting the controller with the dynamometer means and the controller with the blowers;

first filters disposed in the conductors to filter electromagnetic noise propagated from the controller to the dynamometer means; and second filters disposed in the conductors to filter electromagnetic noise propagated from the controller to said blowers.

DESCRIPTION OF THE PREFERRED EMBODIMENT

Figure 1:
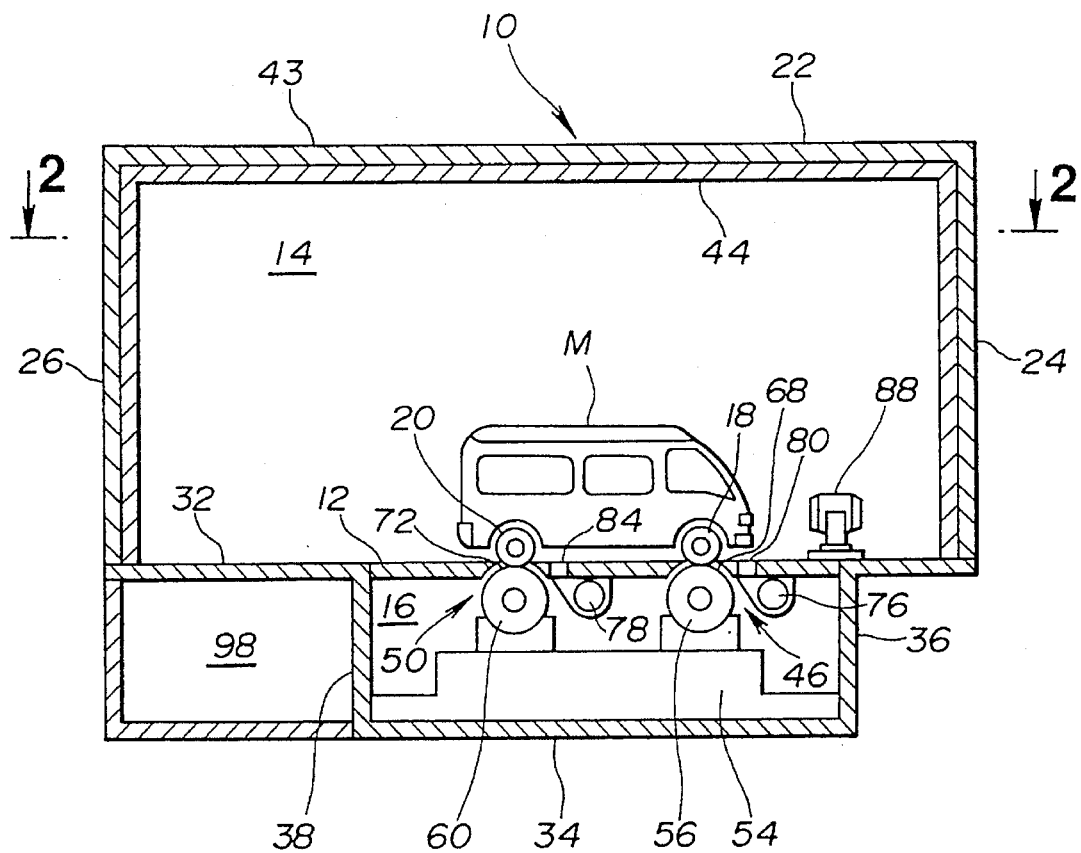
FIG. 1 is a schematic longitudinal section, taken along the line 1—1 of FIG. 2, of an apparatus for simulating electromagnetic compatibility of an automobile having road wheels, according to the present invention, showing the automobile located in the apparatus.
Figure 2:
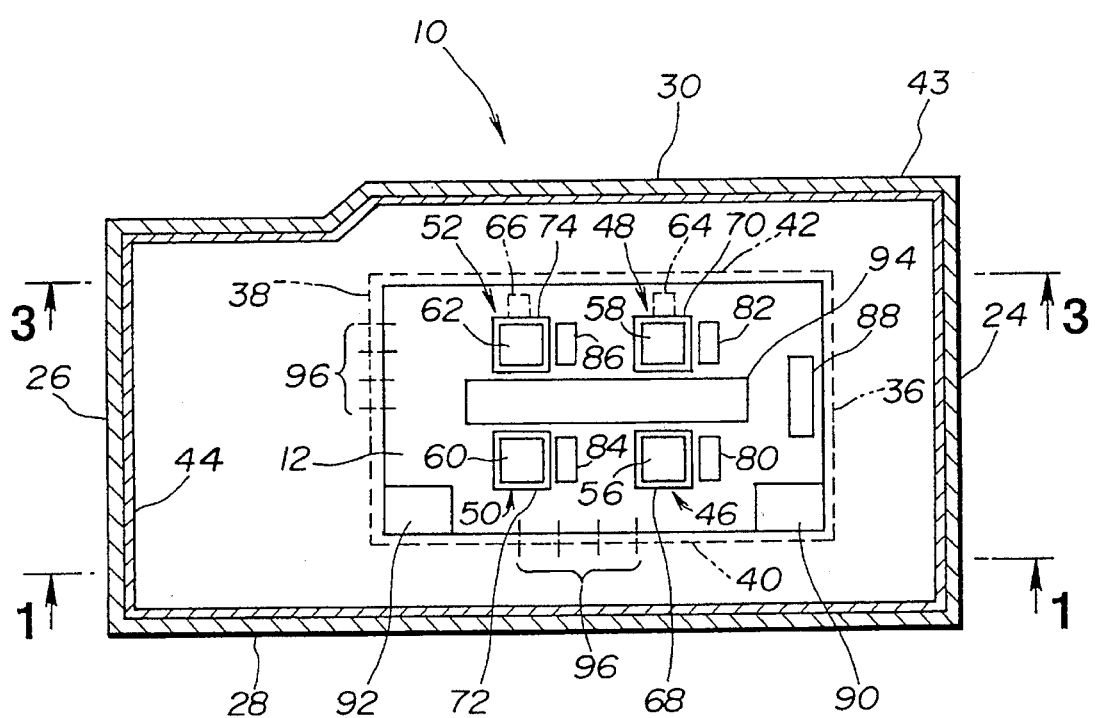
FIG. 2 is a schematic section taken along the line 2—2 of FIG. 1.
Figure 3:
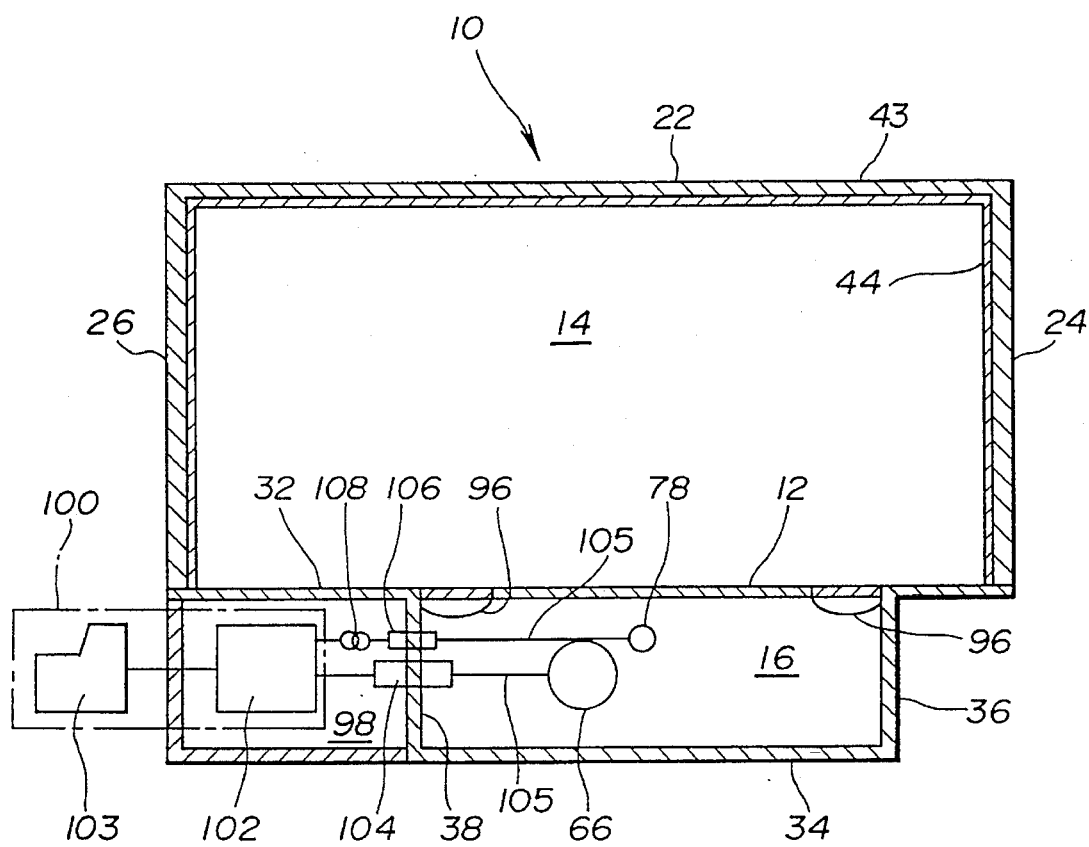
FIG. 3 is a section taken along the line 3—3 of FIG. 2 and illustrates a circuit diagram including a rear wheel dynamometer, a rear wheel blower and a controller.

Referring now to FIGS. 1 to 3, the first embodiment of an electromagnetic isolating apparatus according to the invention is described.

As illustrated in FIGS. 1 to 3, the apparatus comprises an electromagnetically shielded cell 10 of a generally box shape. The electromagnetically shielded cell 10 has a wall 12 dividing the interior of the cell 10 into a first chamber 14 and a second chamber 16. The first chamber 14 serves for placing an automobile M to be tested. The automobile M has a pair of front road wheels and a pair of rear road wheels, front and rear road wheels being indicated at 18 and 20 in FIG. 1. The automobile M is located within the first chamber 14 of the cell 10 for simulation of electromagnetic compatibility thereof. The first chamber 14 is defined by a top wall 22, side walls 24, 26, 28 and 30 formed integrally with the top wall 22, which are made of a galvanized sheet iron of 2.3 mm in thickness, and a bottom wall 32 which is made of iron plate of 6 mm in thickness and connected with the side walls 24, 26, 28 and 30. The second chamber 16 acts as a pit and is defined by a bottom wall 34 and side walls 36, 38, 40 and 42 joined with the bottom wall 34, which are made of iron plate of 6 mm in thickness. The bottom and side walls 34, 36, 38, 40 and 42 of the second chamber 16 are formed integrally with the bottom wall 32 of the first chamber 14. Thus, there is provided an integral electromagnetic shielding wall 43 for shielding the first and second chambers 14 and 16 from passing of electromagnetic wave between the first and second chambers 14 and 16 and environments around the first and second chambers 14 and 16, but permitting reflection of electromagnetic wave thereinside. The wall 12 is located in flush with the bottom wall 32 of the first chamber 14 and made of the same material as mentioned above for the bottom wall 32. The wall 12 acts as a pit cover interposed between the first and second chambers 14 and 16 to restrict entrance of electromagnetic wave from the second chamber 16, viz. pit, into the first chamber 14. The first chamber 14 includes an electromagnetic wave absorber 44 attached onto the top and side walls 22, 24, 26, 28 and 30. The electromagnetic wave absorber 44 is made of ferrite material in the form of a plurality of tiles, pyramidic wedges or the like to absorb electromagnetic wave. Thus, the first chamber 14 serves as semi-anechoic chamber within which reflection of electromagnetic wave is restricted.

A front road simulator units 46 and 48 and a rear road simulator units 50 and 52 are mounted within the second chamber 16 as seen from FIGS. 1 and 2. The road simulator units 46, 48, 50 and 52 are actuatable to simulate a road surface in contact with the rotating road wheels 18 and 20 of the automobile M. The road simulator units 46, 48, 50 and 52 are anchored to a support frame 54 disposed within the second chamber 16. The front road wheels 18 are supported on the front road simulator units 46 and 48 and the rear road wheels 20 are supported on the rear road simulator units 50 and 52, respectively, as shown in FIG. 1. The road simulator units 46, 48, 50 and 52 include rollers 56, 58, 60 and 62 as illustrated in FIG. 2. A front wheel dynamometer 64 and a rear wheel dynamometer 66 are mounted within the second chamber 16 in driving relation with the front road simulator units 46 and 48 and the rear road simulator units 50 and 52, respectively. The front wheel dynamometer 64 is disposed coaxially with the rollers 56 and 58 of the front road simulator units 46 and 48. The rear wheel dynamometer 66 is disposed coaxially with the rollers 60 and 62 of the rear road simulator units 50 and 52.

As best shown in FIG. 2, the wall 12 has a plurality of rectangular windows 68, 70, 72 and 74 for allowing driving contact of the front and rear road simulator units 46, 48, 50 and 52 with the front and rear road wheels 18 and 20. When the automobile M is held in place within the first chamber 14 as shown in FIG. 1, the front road wheels 18 contact with the corresponding rollers 56 and 58 of the front road simulator units 46 and 48 through the windows 68 and 70 and the rear road wheels 20 contact with the corresponding rollers 60 and 62 of the rear road simulator units 50 and 52 through the windows 72 and 74.

Referring back to FIG. 1, front wheel blowers 76 and rear wheel blowers 78 are disposed within the second chamber 16 for respectively cooling the front road wheels 18 and the rear road wheels 20 of the automobile M during operation of the simulating apparatus. The front wheel blowers 76 and the rear wheel blowers 78 are secured to a bottom surface of the wall 12. Blower openings 80, 82, 84 and 86 are disposed adjacent the windows 68, 70, 72 and 74 in the wall 12 as shown in FIG. 2. The front and rear wheel blowers 76 and 78 feed air into the first chamber 14 through the blower openings 80, 82, 84 and 86. Reference numeral 88 denotes an engine cooling blower disposed on the wall 12 within the first chamber 14. As illustrated in FIG. 2, inspection window shutters 90 and 92 are disposed to cover inspection windows provided at two corner portions of the wall 12 for inspection of the inside of the second chamber 16. An inspection window shutter 94 of elongated rectangular shape is arranged to cover an inspection window provided at a mid-portion of the wall 12 for an inspection work of the automobile M. Grounding conductors made of copper as indicated at 96 in FIGS. 2 and 3 are disposed on a periphery of the wall 12 in an equidistant relation, for instance 30 cm, to connect the wall 12 with the side walls 36, 38, 40 and 42 of the second chamber 16, viz. the integral electromagnetic shielding wall 43 of the electromagnetically shielded cell 10. Thus, the wall 12 is kept in same potential as the integral electromagnetic shielding wall 43 through the grounding conductors 96. In FIG. 2, the grounding conductors 96 are shown at a portion of the periphery of the wall 12 for simplicity of illustration.

As illustrated in FIGS. 1 and 3, a third chamber 98 is disposed outside the electromagnetically shielded cell 10 and adjacent the second chamber 16. The bottom wall 32 of the first chamber 14 is disposed between the first chamber 14 and the third chamber 98. As shown in FIG. 3, a controller 100 is disposed outside the first and second chambers 14 and 16 to prevent electromagnetic wave from entering the first and second chambers 14 and 16.

Figure 4:
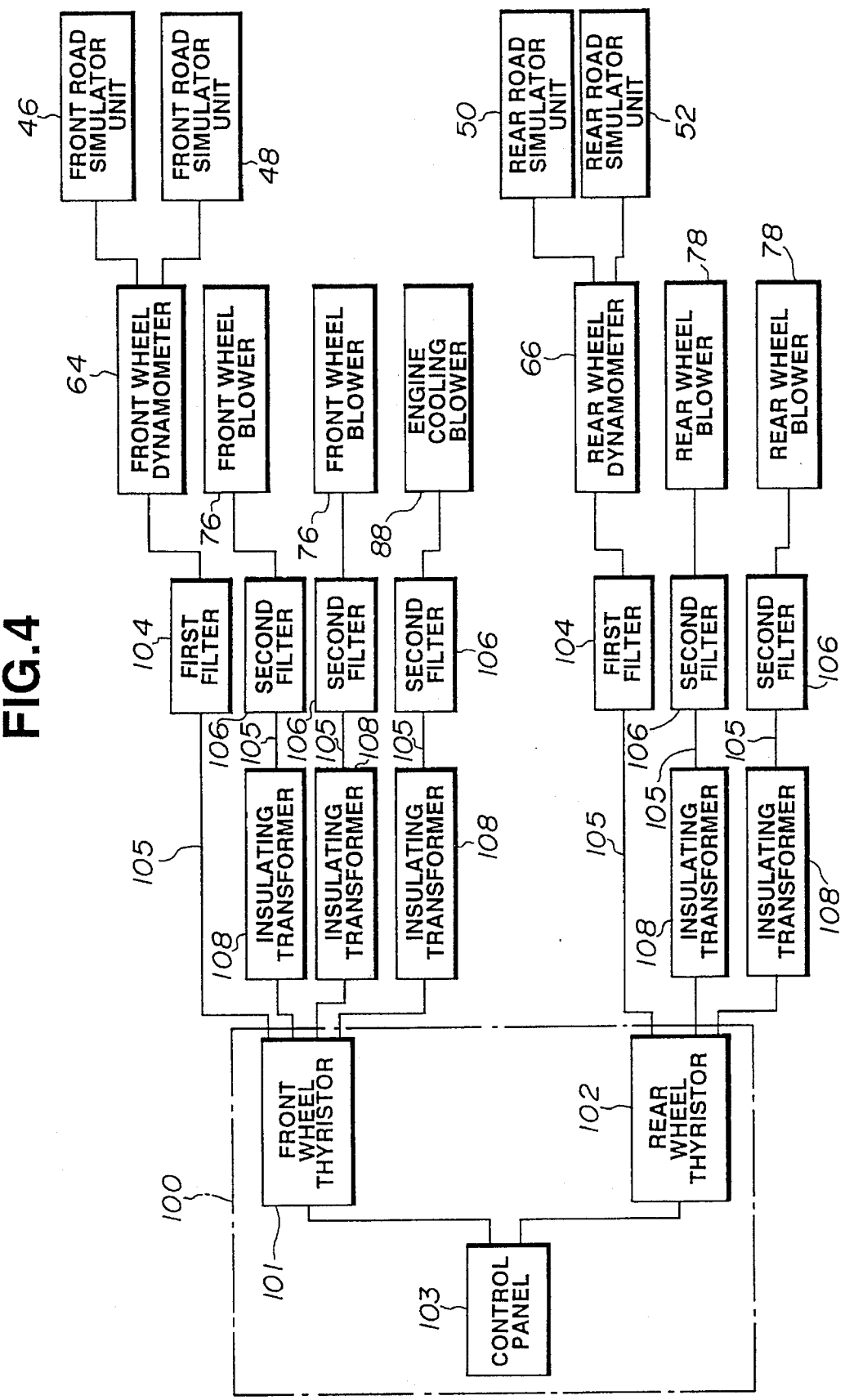
FIG. 4 is a block diagram showing a connection between a controller, front and rear wheel dynamometers and blowers.

As seen from FIGS. 3 and 4, the controller 100 includes a front wheel thyristor 101 and a rear wheel thyristor 102 and a control panel 103 connected with the thyristors 101 and 102. The front wheel thyristor 101 is provided for turning on and off the connection between the controller 100 and the front wheel dynamometer 64, the connection between the controller 100 and the front wheel blowers 76, and the connection between the controller 100 and the engine cooling blower 88. The rear wheel thyristor 102 is provided for turning on and off the connection between the controller 100 and the rear wheel dynamometer 66 and the connection between the controller 100 and the rear wheel blowers 78. The front wheel thyristor 101 and the rear wheel thyristor 102 are disposed within the third chamber 98. As illustrated in FIG. 4, conductors 105 connect the controller 100 with the front wheel dynamometer 64 and the rear wheel dynamometer 66, and the controller 100 with the front wheel blowers 76, the rear wheel blowers 78 and the engine cooling blower 88. First filters 104 are disposed in the conductors 105 to filter electromagnetic noise propagated from the controller 100 to the front wheel and rear wheel dynamometers 64 and 66. Second filters 106 are disposed in the conductors 105 to filter electromagnetic noise propagated from the controller 100 to the blowers 76, 78 and 88. The first and second filters 104 and 106 or the conductors 105 are grounded at the electromagnetic shielding wall 43 so that they are held in the same potential. The first and second filters 104 and 106 are preferably disposed in the electromagnetic shielding wall 43 as illustrated in FIG. 3. Alternatively, the conductors 105 serving for connecting the first and second filters 104 and 106 with the dynamometers 64 and 66 and the blowers 76, 78 and 88 are allowed to pass through conductive pipes disposed in the electromagnetic shielding wall 43. Insulating transformers 108 are disposed in the conductors 105 to restrain resonance occurring between the controller 100 and the second filters 106.

As illustrated in FIG. 4, the front wheel thyristor 101 is connected through the corresponding first filter 104 with the front wheel dynamometer 64 drivingly connected with the front road simulator units 46 and 48. The front wheel thyristor 101 is connected with the front wheel blowers 76 and the engine cooling blower 88 through the corresponding insulating transformers 108 and second filters 106. The rear wheel thyristor 102 is connected through the corresponding first filter 104 with the rear wheel dynamometer 66 drivingly connected with the rear road simulator units 50 and 52. The rear wheel thyristor 102 is connected with the rear wheel blowers 78 through the corresponding insulating transformers 108 and second filters 106.

Figure 5:
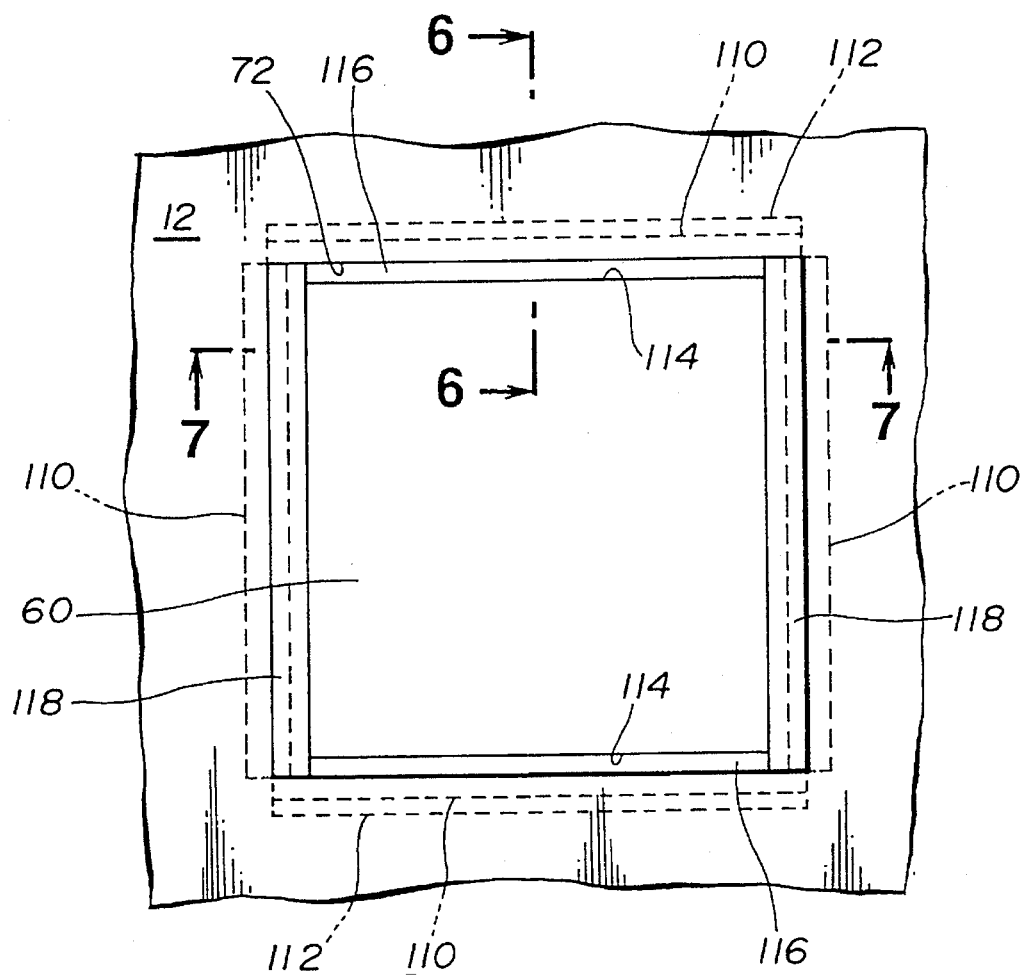
FIG. 5 is a fragmentary enlarged plan view of a wall formed with a window, showing an arrangement for preventing electromagnetic wave from passing through the window.
Figure 6:
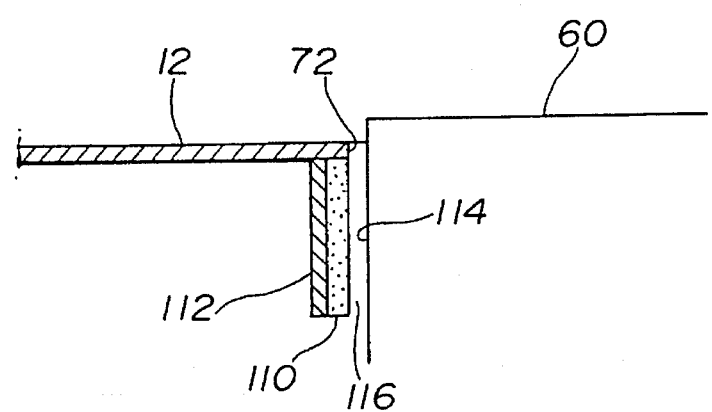
FIG. 6 is a sectional view taken along the line 6—6 of FIG. 5.
Figure 7:
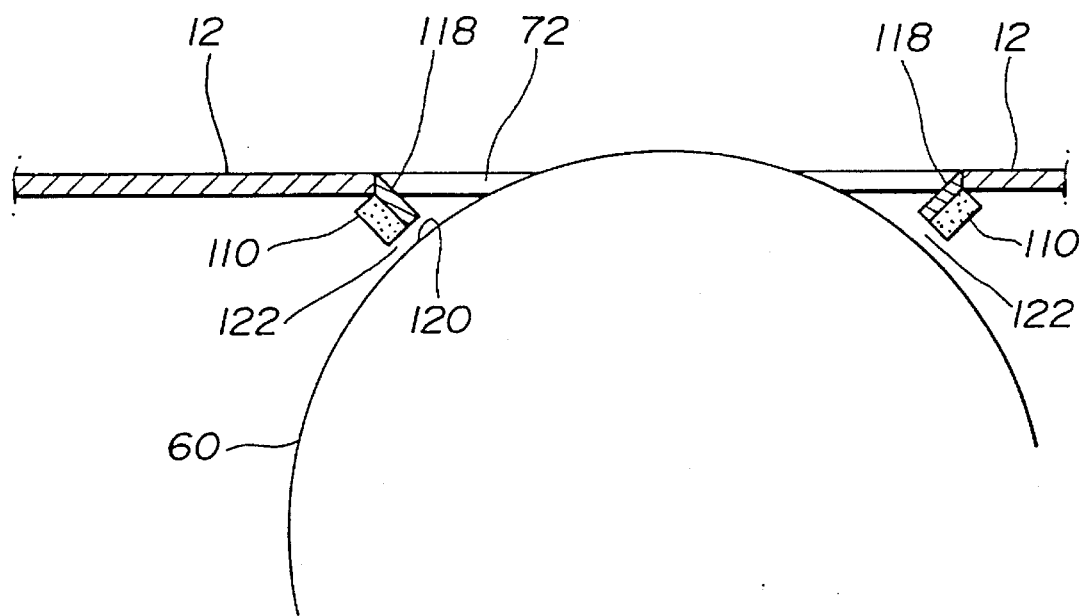
FIG. 7 is a sectional view taken along the line 7—7 of FIG. 5.

Referring to FIGS. 5 and 6, there is shown an electromagnetic wave absorber 110 provided for preventing electromagnetic wave from entering the first chamber 14 through the windows 68, 70, 72 and 74. As illustrated in FIGS. 5 and 6, the electromagnetic wave absorber 110 is fixed to a periphery of the rectangular window 72. The rectangular window 72 is formed with cover portions 112 extending from the second chamber 16 from peripheral portions of the window 72 which face axial end faces 114 of the roller 60, in a spaced relation to the axial end faces 114. The electromagnetic wave absorber 110 is attached to the cover portion 112 of the window 72 and opposed to the axial end face 114 of the roller 60 with a predetermined clearance 116. Similarly, the electromagnetic wave absorber 110 is attached to a bottom surface of each of sloped cover portions 118 extending from the peripheral portions of the window 72 toward a radial peripheral surface 120 of the roller 60. The sloped cover portion 118 and the electromagnetic wave absorber 110 thereon are spaced apart from the radial peripheral surface 120 of the roller 60 with a predetermined clearance as indicated at 122 of FIG. 7. The electromagnetic wave absorber 110 is made of a ferrite tile. The electromagnetic wave absorber 110 has a capability of reducing field intensity of electromagnetic wave by approximately 10 dB in the range of 30–1000 MHz. The reduction of field intensity caused by the absorber 110 results in decreasing the field intensity in the first chamber 14 to a preferable predetermined level.

Figure 8:
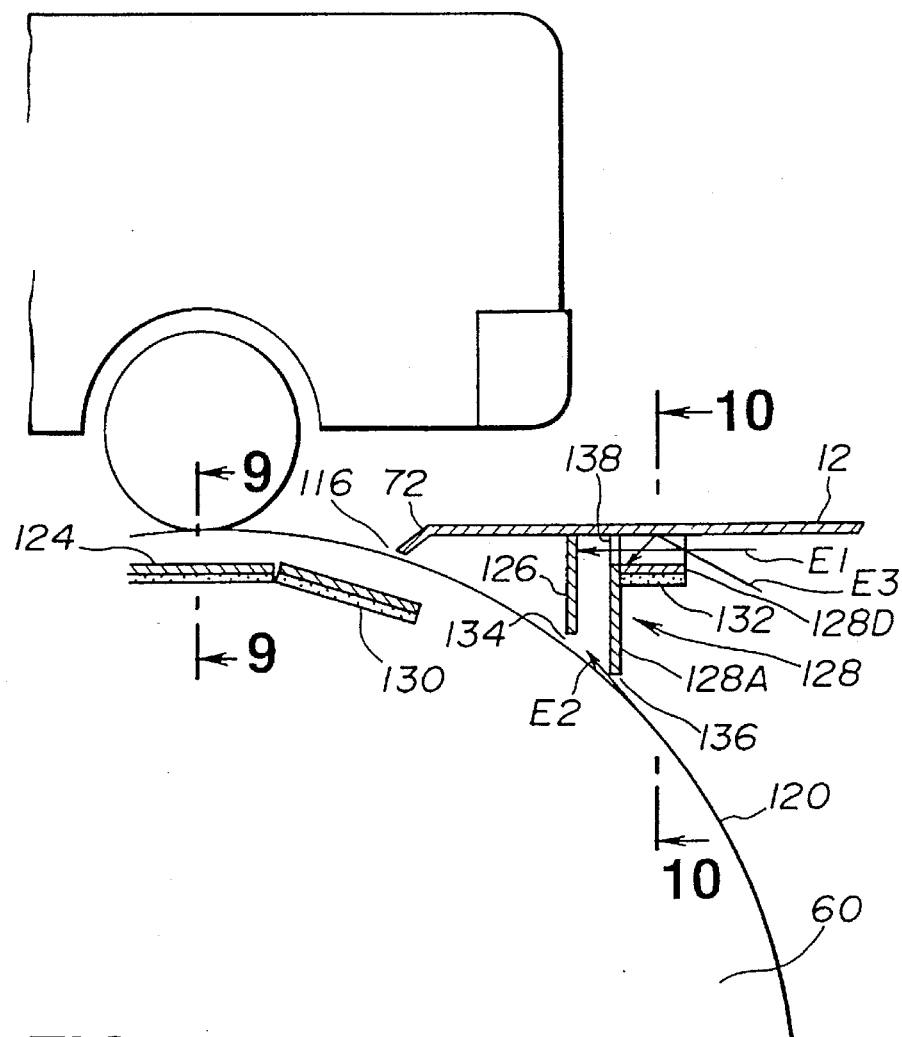
FIG. 8 is a fragmentary sectional view of the wall of FIG. 5, but showing a modified arrangement different from the arrangement of FIG. 5.
Figure 11:
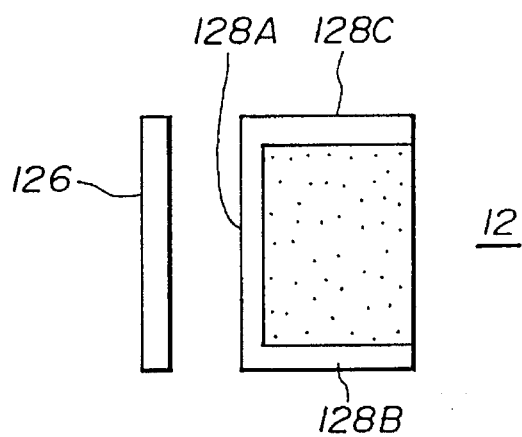
FIG. 11 is a bottom plan view of the modified arrangement of FIG. 8.
Figure 9:
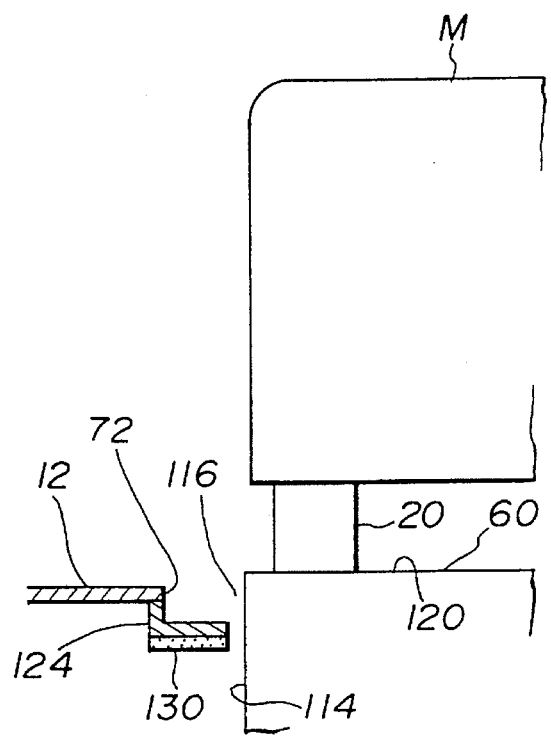
FIG. 9 is a section taken along the line 9—9 of FIG. 8.
Figure 10:
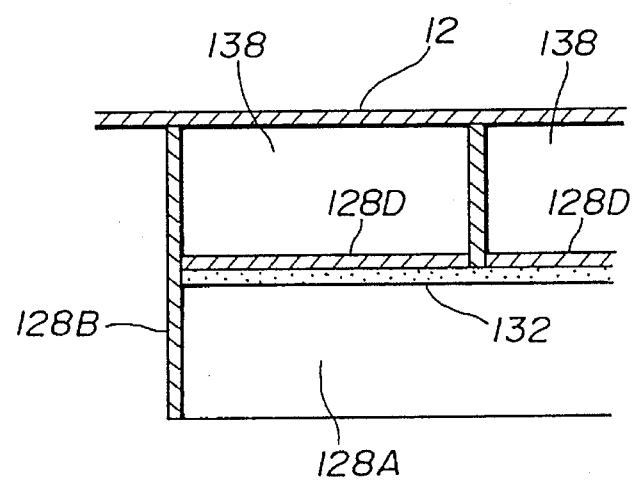
FIG. 10 is a fragmentary enlarged section taken along the line 10—10 of FIG. 7.

FIGS. 8 to 11 show a modified arrangement for preventing electromagnetic wave from entering the first chamber 14 through each of the windows 68, 70, 72 and 74. Like reference numerals denote like parts and therefore detailed descriptions thereabout are omitted. As illustrated in FIG. 8, the wall 12 is formed with electromagnetic wave reflecting wall portions 124, 126 and 128 disposed along the periphery of the window 72. As best shown in FIG. 9, the electromagnetic wave reflecting wall portion 124 having a generally L shape in section extends from the peripheral edge of the wall 12 toward the axial end face 114 of the roller 60. An electromagnetic wave absorber 130 made of ferrite is fixed to an inner surface of the generally L-shaped wall portion 124 which faces the second chamber 16. The wall portion 124 reflects electromagnetic wave generated in the second chamber 16 and causes attenuation of the electromagnetic wave. The electromagnetic wave absorber 130 attenuates the electromagnetic wave reflected on the axial end face 114 of the roller 60 as well as the electromagnetic wave directed to the absorber 130. Thus, the wall portion 124 and the electromagnetic wave absorber 130 cooperate with each other to prevent electromagnetic wave from entering the first chamber 14 through the window 72. As shown in FIG. 8, the wall portions 126 and 128 extend from the wall 12 toward the radial peripheral surface 120 of the roller 60 and in a spaced relation to each other. There exist clearances 134 and 136 between distal ends of the wall portions 126 and 128 and the radial peripheral surface 120 of the roller 60. The wall portion 128 has a generally vertically extending front portion 128A and generally vertically extending side portions 128B and 128C joined with the front portion 128A as shown in FIG. 11. A laterally extending absorber mount portion 128D is interposed between the generally vertically extending side portions 128B and 128C. An electromagnetic wave absorber 132 is attached by a conductive bonding agent to a bottom surface of the absorber mount portion 128D which faces the radial peripheral surface 120 of the roller 60. An aperture 138 is defined by the wall 12, the side portions 128B and 128C and absorber mount portion 128D of the wall portion 128. As shown in FIG. 10, the aperture 138 is divided into two parts by a generally vertically extending partition portion joined with the wall 12 and the absorber mount portion 128D. References E1, E2 and E3 of FIG. 8 denote electromagnetic waves orienting in different directions. Electromagnetic wave E1 passing through the aperture 138 is reflected on the wall portion 126 and thereby attenuated, as well as electromagnetic wave E2 passing through the clearance 136. Electromagnetic wave E3 is reflected on the wall 12 and then the absorber mount portion 128D to be attenuated. The electromagnetic wave absorber 132 attenuates electromagnetic wave reaching the absorber 132 after reflecting on the front and side portions 128A, 128B and 128C of the wall portion 128. Thus, the wall portions 126 and 128 and the electromagnetic wave absorber 132 cooperate with each other to disturb the electromagnetic wave from entering the first chamber 14 through the window 72. The provision of the aperture 138 serves for preventing resonance of electromagnetic wave reflected between the wall portions 126 and 128.

Figure 12:
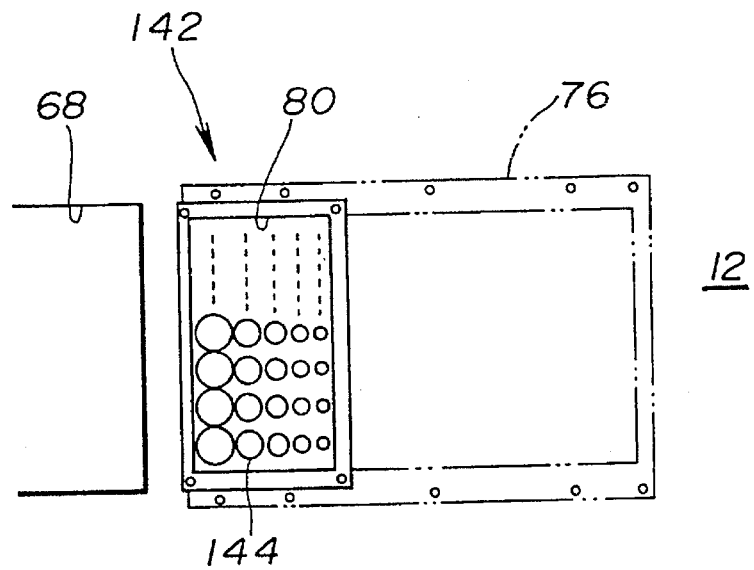
FIG. 12 is a fragmentary plan view of the wall formed with a blower opening, showing an arrangement for preventing electromagnetic wave from passing through the blower opening.
Figure 13:
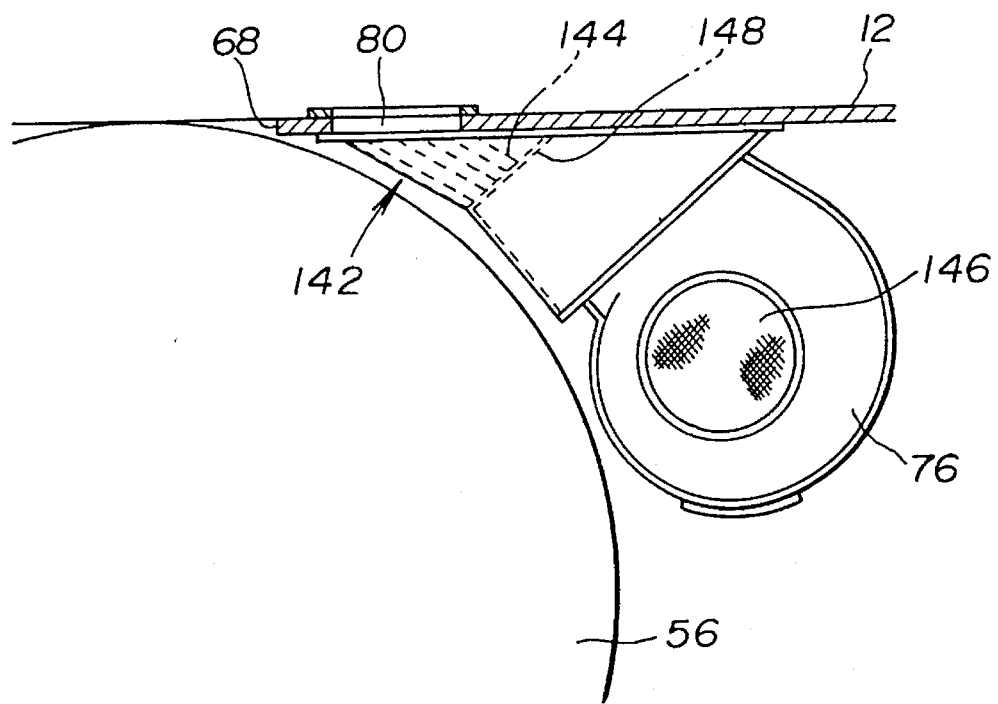
FIG. 13 is a section of FIG. 12.

Referring to FIGS. 12 and 13, there is shown an electromagnetic wave reflector 142 provided for preventing electromagnetic wave from entering the first chamber 14 through each of the blower openings 80, 82, 84 and 86. As illustrated in FIGS. 12 and 13, the electromagnetic wave reflector 142 is in the form of a plurality of metal pipes 144 disposed between the front wheel blower 76 and the blower opening 80. As best shown in FIG. 12, the front wheel blower 76 welded at the bottom surface of the wall 12 has an air intake 146 and an air outlet 148. Each of the metal pipes 144 has one end connected with the outlet 148 of the front wheel blower 76 and the other end open into the blower opening 80. The metal pipes 144 reflect the electromagnetic wave passing therethrough and thereby attenuate the electromagnetic wave. Thus, the metal pipes 144 serve for reduction of the electromagnetic wave passing through the blower openings 80 between the first and second chambers 14 and 16. The metal pipes 144 are different in size. As shown in FIGS. 12 and 13, the metal pipes 144 are arranged such that the metal pipe 144 with an increased diameter and length is disposed close to a radial peripheral surface of the roller 56 and the metal pipe 144 with a reduced diameter and length is disposed remote from the radial peripheral surface of the roller 56. The metal pipe 144 with the increased diameter and length serves for enhancing attenuation of the electromagnetic wave having lower frequency. The metal pipe 144 with the reduced diameter and length serves for enhancing attenuation of the electromagnetic wave having higher frequency. This arrangement of the metal pipes 144 different in size allows attenuation of the electromagnetic wave with a wide frequency range.

Figure 14:
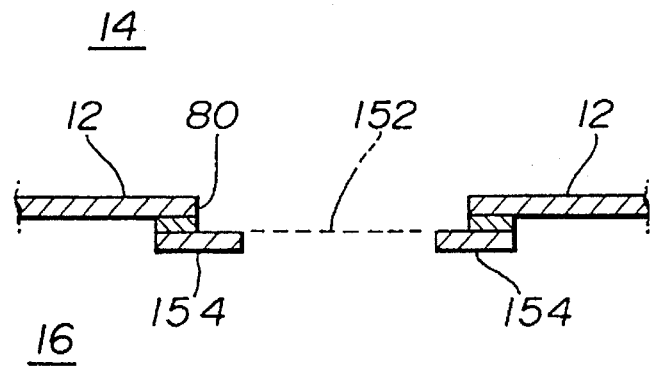
FIG. 14 is a fragmentary enlarged section of the wall formed with the blower opening, showing a modified arrangement for preventing electromagnetic wave from passing through the blower opening.

Referring to FIG. 14, there is shown a modified arrangement provided for preventing electromagnetic wave from entering the first chamber 14 through each of the blower openings 80, 82, 84 and 86. Like numerals denote like parts and therefore detailed descriptions thereabout are omitted. As illustrated in FIG. 14, an expanded metal 152 is secured to a periphery of the blower opening 80 to cover the blower opening 80. The expanded metal 152 is attached to a support portion 154 disposed on the bottom surface of the wall 12 along the periphery of the blower opening 80. The expanded metal 152 is in the form of a grid or mesh made of a material having a high conductivity such as copper.

Figure 15:
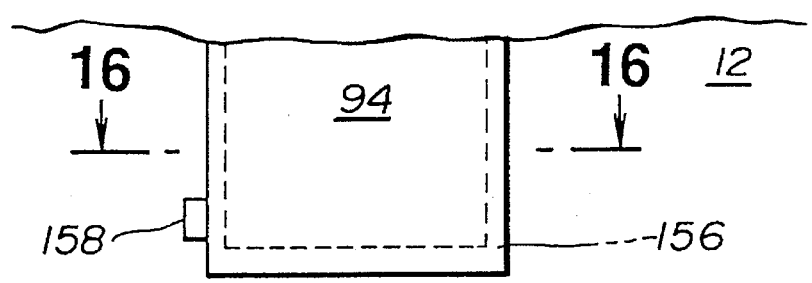
FIG. 15 is a fragmentary plan view of a shutter covering an inspection window.
Figure 16:
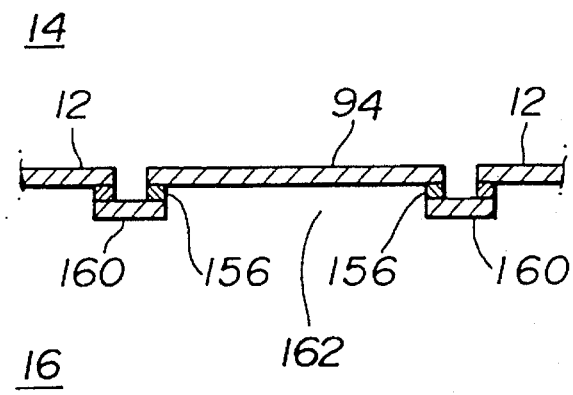
FIG. 16 is a section taken along the line 16—16 of FIG. 15.

Referring to FIGS. 15 and 16, there is shown an electromagnetic wave shielding net 156 provided for preventing electromagnetic wave from entering the first chamber 14 through the inspection window shutters 90, 92 and 94. The electromagnetic wave shielding net 156 is made of a material with a high conductivity, for instance, copper. As illustrated in FIG. 15, the electromagnetic wave shielding net 156 is disposed on a peripheral portion of the shutter 94. The shutter 94 is hinged as indicated at 158 of FIG. 15. As illustrated in FIG. 16, when the shutter 94 is in a closed position, the electromagnetic wave shielding net 156 contacts a shutter support portion 160 disposed on the bottom surface of the wall 12 along a periphery of the inspection window 162.

What is claimed is:

1. An apparatus for electromagnetically isolating an automobile having road wheels from an environment surrounding the automobile, comprising:

a first chamber for the automobile;

a second chamber disposed adjacent said first chamber;

means for shielding said first and second chambers from passing of electromagnetic wave between said first and second chambers and environments around said first and second chambers;

a wall disposed between said first and second chambers to cover said second chamber;

road simulator units mounted within said second chamber;

dynamometer means mounted within said second chamber in driving relation with said road simulator units;

blowers mounted within said second chamber;

a controller disposed outside said first and second chambers to prevent electromagnetic wave from entering said first and second chambers;

conductors connecting said controller with said dynamometer means and said controller with said blowers;

first filters disposed in said conductors to filter electromagnetic noise propagated from said controller to said dynamometer means; and second filters disposed in said conductors to filter electromagnetic noise propagated from said controller to said blowers.

2. An apparatus as claimed in claim 1, wherein said controller includes thyristor means for turning on and off connection between said controller and said dynamometer means and connection between said controller and said blowers.

3. An apparatus as claimed in claim 1, further comprising an insulating transformer disposed in said conductors to restrain resonance occurring between said controller and said second filters.

4. An apparatus as claimed in claim 1, wherein said wall has window means for allowing driving contact of said road simulator units with the road wheels and further comprising means for preventing the electromagnetic wave from entering said first chamber through said window means.

5. An apparatus as claimed in claim 4, wherein said preventing means includes an electromagnetic wave absorber fixed to said window means.

6. An apparatus as claimed in claim 4, wherein said preventing means includes electromagnetic wave reflecting wall portions disposed along a periphery of said window means.

7. An apparatus as claimed in claim 6, wherein said preventing means includes an electromagnetic wave absorber fixed to said electromagnetic wave reflecting wall portions.

8. An apparatus as claimed in claim 1, wherein said wall has blower openings through which said blowers feed air into said first chamber and further comprising means for preventing the electromagnetic wave from entering said first chamber through said blower openings.

9. An apparatus as claimed in claim 8, wherein said preventing means includes an expanded metal covering said blower openings.

10. An apparatus as claimed in claim 8, wherein said preventing means includes an electromagnetic wave reflector in the form of a plurality of metal pipes disposed between said blower and said blower opening.

11. An apparatus as claimed in claim 1, wherein said wall has inspection windows covered with shutters and further comprising means for preventing the electromagnetic wave from entering said first chamber through said inspection windows.

12. An apparatus as claimed in claim 11, wherein said preventing means includes an electromagnetic wave shielding net disposed on said shutters.

13. An apparatus for electromagnetically isolating an automobile having road wheels from an environment surrounding the automobile, comprising:

an electromagnetically shielded cell having a wall dividing an interior within said cell into a first chamber for the automobile and a second chamber;

road simulator units mounted within said second chamber;

dynamometer means mounted within said second chamber in driving relation with said road simulator units;

said wall having window means for allowing driving contact of said road simulator units with the road wheels, said window means having a periphery; and means for preventing an electromagnetic wave from entering said first chamber through said window means;

said preventing means including an electromagnetic wave absorber disposed within said second chamber along said periphery of said window means.

14. An apparatus as claimed in claim 13, wherein said wall is formed with portions extending from said periphery of said window means toward said road simulator units in said second chamber, said electromagnetic wave absorber being fixed to each of said portions.

15. An apparatus as claimed in claim 13, wherein said wall is formed with electromagnetic wave reflecting wall portions extending toward said road simulator units in said second chamber, said electromagnetic wave absorber being attached to each of said electromagnetic wave reflecting wall portions.

16. An apparatus as claimed in claim 13, further comprising blowers disposed within said second chamber, and wherein said wall has blower openings for allowing air feed into said first chamber and means for preventing an electromagnetic wave from entering said first chamber through said blower openings.

17. An apparatus as claimed in claim 16, wherein said preventing means includes an expanded metal covering each of said blower openings.

18. An apparatus as claimed in claim 16, wherein said preventing means includes an electromagnetic wave reflector in the form of a plurality of metal pipes (14) disposed between said blower and said blower opening.

19. An apparatus as claimed in claim 13, wherein said wall has inspection windows covered with shutters and further comprising means for preventing the electromagnetic wave from entering said first chamber through said inspection windows.

20. An apparatus as claimed in claim 19, wherein said preventing means includes an electromagnetic wave shielding net disposed on said shutters.

* * * * *